United States Patent
Petropoulos et al.

(10) Patent No.: US 6,342,787 B1
(45) Date of Patent: Jan. 29, 2002

(54) REAL-TIME MULTI-AXIS GRADIENT DISTORTION CORRECTION USING AN INTERACTIVE SHIM SET

(75) Inventors: Labros S. Petropoulos, Solon; Heidi A. Schlitt, Chesterland; Michael R. Thompson, Cleveland Heights, all of OH (US)

(73) Assignee: Philips Medical Systems (Cleveland), Highland Heights, OH (US)

( * ) Notice: Subject to any disclaimer, the term of this patent is extended or adjusted under 35 U.S.C. 154(b) by 0 days.

(21) Appl. No.: 09/718,553

(22) Filed: Nov. 22, 2000

(51) Int. Cl.$^7$ .................................................. G01V 3/00
(52) U.S. Cl. ...................................... 324/320; 324/319
(58) Field of Search ................................. 324/320, 319, 324/318, 306, 307, 309, 322, 300

(56) References Cited

U.S. PATENT DOCUMENTS

| | | | |
|---|---|---|---|
| 4,591,789 A | 5/1986 | Glover et al. ................ 324/307 |
| 4,794,338 A | 12/1988 | Roemer et al. ................ 324/39 |
| 5,132,618 A | 7/1992 | Sugimoto .................... 324/318 |
| 5,258,711 A | 11/1993 | Hardy ........................ 324/309 |
| 5,289,127 A | 2/1994 | Doddrell et al. ............. 324/314 |
| 5,296,810 A | 3/1994 | Morich ....................... 324/318 |
| 5,373,239 A | * 12/1994 | Marek et al. ................ 324/320 |
| 5,532,597 A | 7/1996 | McGinley et al. ............ 324/319 |
| 5,635,839 A | 6/1997 | Srivastava et al. ........... 324/320 |
| 5,736,858 A | 4/1998 | Katznelson et al. ........ 324/318 |
| 5,755,666 A | 5/1998 | Bornert et al. .............. 324/309 |
| 5,760,582 A | * 6/1998 | Morrone ..................... 324/318 |
| 5,770,943 A | * 6/1998 | Zhou ......................... 324/307 |
| 5,786,695 A | 7/1998 | Amor et al. ................. 324/320 |

* cited by examiner

Primary Examiner—Louis Arana
(74) Attorney, Agent, or Firm—Fay, Sharpe, Fagan, Minnich & McKee, LLP

(57) ABSTRACT

A magnetic resonance apparatus includes a main magnet (12) which generates a main magnetic field through and surrounding an examination region (14). The main magnetic field contains inhomogeneities which affect image quality. A gradient coil assembly (22) generates gradient magnetic fields across the examination region, which contain higher order harmonics causing inhomogeneities in the gradient magnetic field. A multi-axis shim set (23) is selectively excited in order to cancel both the main magnetic and gradient magnetic field inhomogeneities. More particularly, DC currents are applied by a shim coil power supply (25) to cancel the main magnetic field inhomogeneities. AC current pulses are superimposed on the DC currents by the shim coil power supply (25) in order to correct the gradient magnetic field inhomogeneities. The existence of correctable higher order gradient magnetic field harmonics provides for fast switching, high duty cycles, and high peak gradients, without adding distortions to the resulting magnetic resonance images.

14 Claims, 5 Drawing Sheets

REAL-TIME MULTI-AXIS GRADIENT DISTORTION CORRECTION USING AN INTERACTIVE SHIM SET

BACKGROUND OF THE INVENTION

The present invention relates to the magnetic resonance arts. It finds particular application in conjunction with gradient coils for a magnetic resonance imaging apparatus and will be described with particular reference thereto. However, it is to be appreciated that the present invention will also find application in conjunction with localized magnetic resonance spectroscopy systems and other applications which utilize gradient magnetic fields.

In magnetic resonance imaging, a spatially uniform and temporally constant magnetic field is created through an examination region in which a subject to be examined is disposed. A series of radio frequency pulses and magnetic field gradients are applied to the examination region. Gradient fields are conventionally applied as a series of gradient pulses with pre-selected profiles. The radio frequency pulses excite magnetic resonance and the gradient field pulses phase and frequency encode the induced resonance. In this manner, phase and frequency encoded magnetic resonance signals are generated.

Many MRI techniques are highly sensitive to magnetic field homogeneity. However, the geometric shape and/or magnetic susceptibility of a subject being scanned, built-in main magnet tolerances, environmental and/or site effects, and the like contribute to the main magnetic field's inhomogeneity and/or non-uniformity. In turn, this leads to imaging problems.

Methods for controlling the homogeneity of the main magnetic field include both passive and active shimming techniques. The passive technique includes arranging shim steel on the inside diameter of the superconductive coil assembly to minimize static magnetic field inhomogeneities based upon NMR field plot measurements. The active shimming technique generally employs multiple orthogonal shim coils and/or gradient coil offsets. An electrical current is applied to the shim coils and/or gradient coil offsets in order to cancel inhomogeneities in the main magnetic fields.

Gradient magnetic field pulses are typically applied to select and encode the magnetic resonance with spatial position. In some embodiments, the magnetic field gradients are applied to select a slice or slab to be imaged. Ideally, the phase or frequency encoding uniquely identifies spatial location. In bore-type magnets, linear magnetic field gradients are commonly produced by cylindrical gradient field coils wound on and around a cylindrical former. Discrete coils are wound in a bunched or distributed fashion on a similar or larger diameter cylindrical tube, commonly 30–65 centimeters in diameter or larger.

Historically, gradient coil designs were developed in a "forward approach," whereby a set of initial coil positions were defined and the fields, energy, and inductance calculated. If these quantities were not within the particular design criteria, the coil positions were shifted (statistically or otherwise) and the results re-evaluated. This iterative procedure continued until a suitable design was obtained.

Recently, gradient coils are designed using the "inverse approach," whereby gradient fields are forced to match predetermined values at specified spatial locations inside the imaging volume. Then, a continuous current density is generated which is capable of producing such fields. This approach is adequate for designing non-shielded or actively shielded gradient coil sets.

Conventional shielded gradient coil sets have been designed based on the assumption that no correction to the magnitude of the higher order gradient magnetic field terms was to be made. Therefore, conventional gradient coil designs force field contributions from terms of higher spatial order to be negligible within the imaging volume. This is usually accomplished by setting specific moment coefficients to be zero. Although such designs enhance the uniformity of the gradient magnetic field with a subsequent improvement in the distortion characteristics of the final image, they are characterized by high inductance and resistance values, which result in a significant reduction in the gradient coil's peak magnetic field, rise time, slew rate, increase in heating characteristics, and reduction in duty cycles.

Conversely, design requirements call for fast switching, high duty cycles, and high peak gradient coils force the introduction of higher order, non-zero terms in the gradient magnetic field. These higher order terms distort image quality by introducing spatial misregistration of spins. Passive distortion correction algorithms have been implemented for the correction of such image distortions. In particular, two distortion correction methods have been employed.

One method includes the use of specially designed RF pulses with a field intensity variance to account for the distortion characteristics of the gradient magnetic field. The pulses are applied prior to pulsing the gradient magnetic field during the MR sequence. One disadvantage of this technique is that it is limited to a two-dimensional MR sequence with limited oblique capabilities. In addition, a signal intensity correction algorithm is necessary during the postprocessing of the MR image.

A second prior art method of gradient distortion correction employs a postprocessing correction algorithm that predicts the image distortions (pixel or voxel displacements) generated by the higher order terms of the gradient magnetic field and attempts to invert this action. However this technique suffers from several disadvantages. First, this technique is ineffective in eliminating aliasing when the gradient coil's rollover point is inside the field of view. Second, a signal intensity correction algorithm must be applied to the undistorted image. Also, the technique is ineffective for gradient field non-uniformities exceeding 35% of the gradient field's ideal value over any imaging volume.

Therefore, a need exists for a gradient coil set with correctable higher order terms. The present invention contemplates a new and improved gradient coil set which overcomes the above-referenced problems and others.

SUMMARY OF THE INVENTION

In accordance with one aspect of the present invention, a magnetic resonance apparatus includes a main magnet which generates a main magnetic field through and surrounding an examination region, where the main magnetic field contains inhomogeneities. A gradient coil assembly generates gradient magnetic fields across the examination region, where the gradient magnetic fields include higher order harmonics. A multi-axis shim set is disposed adjacent the gradient coil assembly. The multi-axis shim set cancels inhomogeneities in the main magnetic field and compensates for distortions caused by the higher order harmonics of the gradient magnetic field. An RF transmitter and coil assembly excites magnetic resonance dipoles in and adjacent the examination region. An RF coil and receiver assembly receive and demodulate magnetic resonance signals from the resonating dipoles. A reconstruction processor reconstructs the demodulated magnetic resonance signals into an image representation.

In accordance with another aspect of the present invention, a method of magnetic resonance imaging includes generating a temporally constant main magnetic field through an examination region, where the main magnetic field contains inhomogeneities. Resonance is induced in selected dipoles in the examination region such that the dipoles generate magnetic resonance signals. A gradient magnetic field, having higher order harmonics which cause image distortions, is generated across the examination region to encode the magnetic resonance signals along at least one axis. Correction currents are applied to shim coils to (i) minimize the inhomogeneities in the main magnetic field and (ii) compensate for the higher order harmonics in the gradient magnetic field. The encoded magnetic resonance signals are received, demodulated, and reconstructed into an image representation free from distortions caused by the higher order harmonics of the gradient magnetic field.

In accordance with another aspect of the present invention, a temporally constant main magnetic field having inhomogeneities is generated in an examination region. Radio frequency pulses excite and manipulate resonance of selected dipoles in a subject disposed in the examination region. Gradient pulses are applied to at least one gradient coil assembly to generate gradient magnetic fields for encoding the excited resonance, where the gradient magnetic fields have inhomogeneities caused by higher order harmonics. Received and demodulated resonance signals are reconstructed into an image representation. A method of real-time correction of the main and gradient magnetic field inhomogeneities includes applying DC correction currents to a multi-axis shim set and superimposing AC correction current pulses on the DC correction currents.

One advantage of the present invention is that it eliminates aliasing effects for magnetic resonance sequences with large fields of view.

Another advantage of the present invention resides in real-time correction of distortions caused by higher orders of the gradient magnetic field.

Another advantage of the present invention is that it eliminates the need for a distortion correction algorithm.

Another advantage of the present invention is that it provides for gradient coil designs of a prescribed dimension which cover a prescribed imaging volume with reduced inductance and increased efficiency.

Another advantage of the present invention is that it reduces post-processing time for a magnetic resonance image.

Yet another advantage of the present invention resides in the elimination of artifacts from distortion characteristics of the magnetic field gradient.

Another advantage of the present invention is that it reduces overall time for a magnetic resonance study.

Still another advantage of the present invention is that increases the effective imaging volume.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
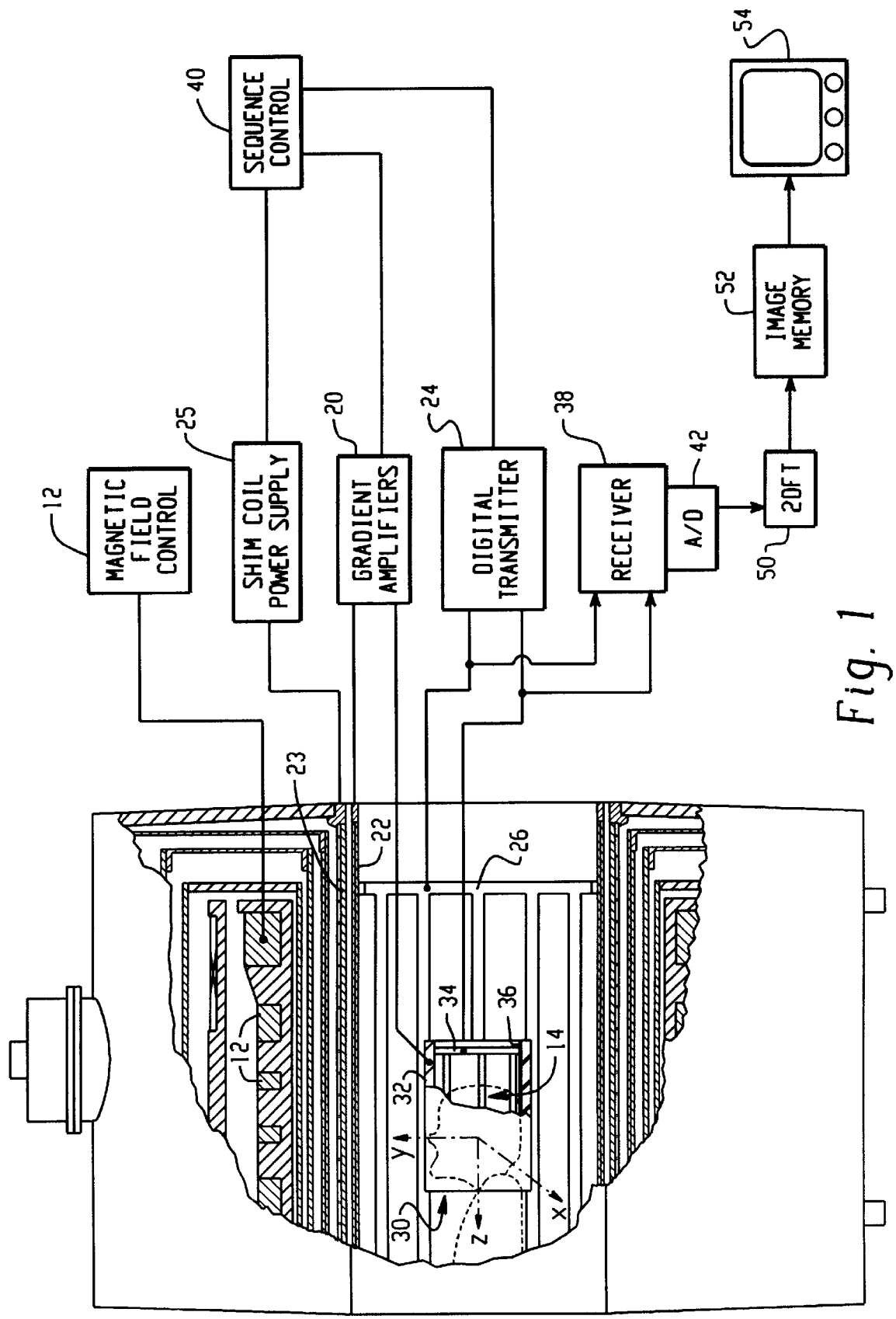
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along a z-axis through an examination region 14. Although a bore-type magnet is illustrated in FIG. 1, it is to be appreciated that the present invention is equally applicable to open magnetic systems with vertically directed fields, or any other magnetic resonance imaging configuration. A couch (not illustrated) suspends a subject to be examined within the examination region 14.

Ideally, the main magnetic field is uniform throughout the examination region 14 or imaging volume. However, in practical application, non-uniformities and/or inhomogeneities are present in the main magnetic field that are deleterious to the reconstructed images. In order to correct these inhomogeneities, a shim coil power supply 25 supplies electric current to a shim coil set 23, which comprises a plurality of dedicated shim or correction coils. Preferably, the active shims 23 take form in 12–18 layers of coils which surround the bore. Alternately, the main magnetic field may be shimmed to correct for inhomogeneities by applying DC gradient offsets to gradient coils 22 via the gradient amplifiers 20.

A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to a gradient coil assembly 22 to create magnetic field gradients along x, y, and z axes of the examination region 14 with zero or minimal fringe fields outside of the bore. As will be described more fully below, higher harmonics of the gradient magnetic fields may cause image distortions. Such distortions are corrected in a real-time fashion by using the shim coil set.

A radio frequency transmitter 24 transmits radio frequency pulses or pulse packets to a whole-body RF coil 26 to transmit RF pulses into the examination region 14. A typical radio frequency pulse is composed of a packet of immediately contiguous pulse segments of short duration which, taken together with each other and any applied gradients, achieve a selected magnetic resonance manipulation. The RF pulses are used to saturate, excite resonance, invert magnetization, refocus resonance, or manipulate resonance in selected portions of the examination region. For whole-body applications, the resonance signals are commonly picked up by the whole-body RF coil 26, but may be picked up by other specialized RF coils.

For generating images of limited regions of the subject, local coils are commonly placed contiguous to the selected region. For example, an insertable head coil 30 is inserted surrounding a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local quadrature radio frequency coil 34 is used to excite magnetic resonance and receive magnetic resonance signals emanating from the patient's head. Alternatively, a receive only local radio frequency coil can be used for quadrature reception of resonance signals introduced by body coil RF transmissions. An RF screen 36 screens the RF signals from the RF head coil from inducing any currents in the gradient coils and the surrounding structures. The resultant radio frequency signals are picked up in quadrature by the whole-body RF coil 26, the local RF coil 34, or other specialized RF coils and demodulated by a receiver 38, preferably a digital receiver.

A sequence control processor 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. In addition, the sequence control processor 40 controls the shim coil power supply 25 to generate a predetermined shim sequence. More particularly, the predetermined shim sequence is tailored to correct both inhomogeneities in the main magnetic field and image distortions caused by higher order harmonics of the gradient magnetic fields. For the selected echo sequence, the receiver 38 receives a plurality of data lines in rapid succession following each RF excitation pulse. An analog-to-digital converter 42 converts each data line to a digital format. The analog-to-digital converter 42 is disposed between the radio frequency receiving coil and the receiver 38 for digital receivers and is disposed downstream (as illustrated) from the receiver for analog receivers.

Ultimately, the radio frequency signals received are demodulated and reconstructed into an image representation by a reconstruction processor 50 which applies a two-dimensional Fourier transform or other appropriate reconstruction algorithm. The image is then stored in an image memory 52. A human-readable display 54, such as a video monitor, provides a human-readable display of the resultant image. The image may represent a planar slice through the patient, an array of parallel planar slices, a three-dimensional volume, or the like.

Figure 2:
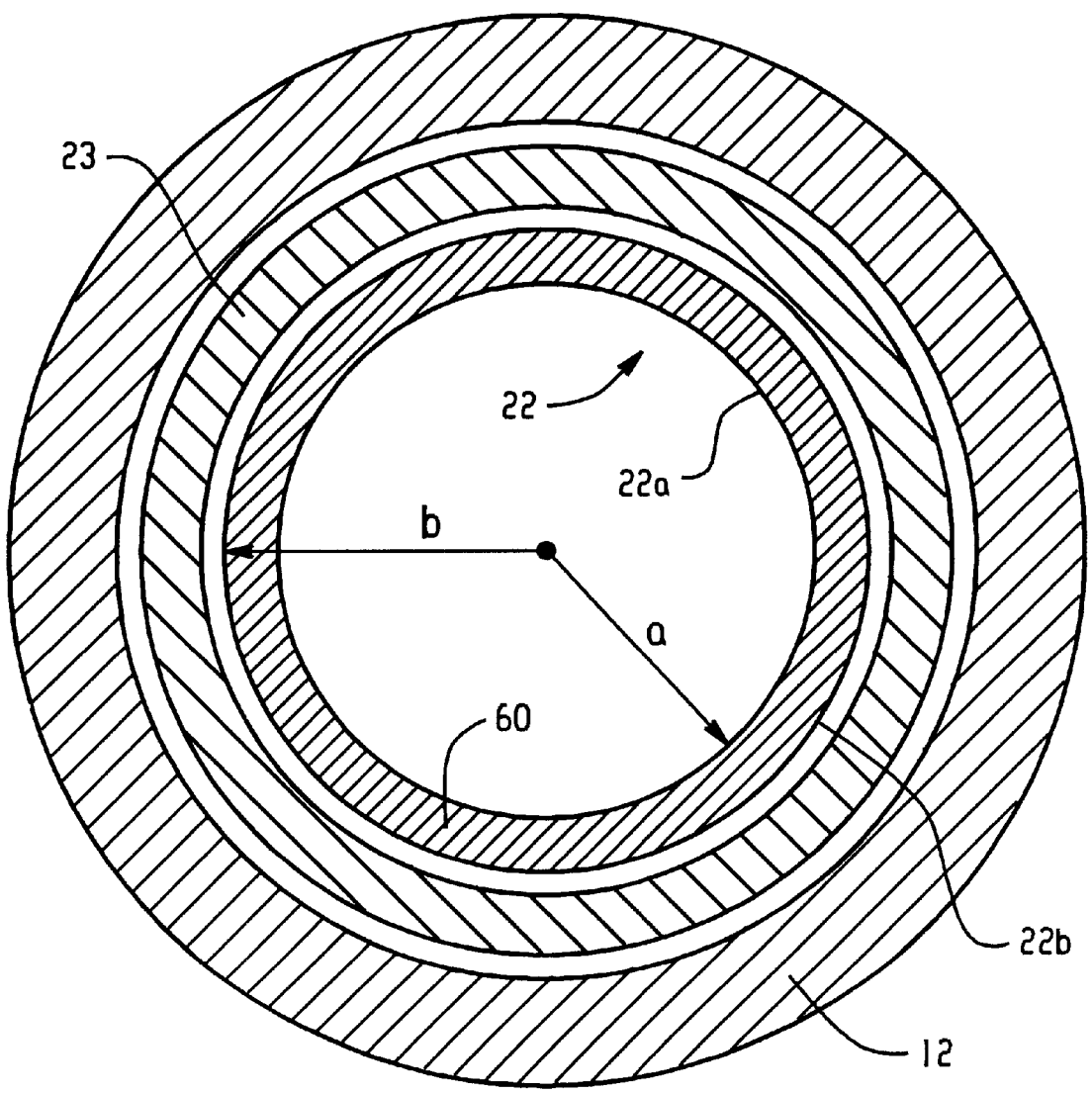
FIG. 2 is a diagrammatic illustration of a cross-section of the magnetic bore in accordance with the present invention.

FIG. 2 illustrates a cross-sectional view of the bore of the magnetic resonance apparatus. In one embodiment, the shim coil assembly 23 is disposed between the main magnet 12 and the gradient coil assembly 22, as shown. The gradient coil assembly 22 includes a dielectric former 60 having an inner radius a and an outer radius b. The gradient coil assembly includes a primary gradient coil set 22a and a secondary or shielding coil set 22b. The shielding coils 22b are designed to cooperate with the primary gradient coil set 22a to generate a magnetic field which has a substantially zero magnetic flux density outside an area defined by the outer radius of the former.

The primary and secondary gradient coil sets are each made up of primary and secondary x, y and z-gradient coils that are mounted on the former 60. In one embodiment, the primary x, y, and z-gradient coils are mounted on the inner surface of radius a of the former, while the secondary x, y, and z-gradient shielding coils are mounted on the outer surface of radius b of the former. The primary and secondary x, y, and z-gradient coils are constructed of a conductive material, such as foil or wire, of patterns determined by the below-referenced design procedure. In one embodiment, the coils are laminated to the cylindrical outer and/or inner surfaces of the former. Alternately, the x, y, and z-gradient coils are wound into grooves in the former and potted in an epoxy. The coil windings are preferably manufactured from a relatively thin conductive sheet, such as copper. The sheet is preferably cut before lamination to the former by water jet cutting, laser cutting, etching, or the like, and then bonded to a thin insulating substrate, minimizing radial thickness.

Prior art gradient coil sets are typically designed based on the assumption that no correction is made to the magnitude of the higher order gradient magnetic field terms. In contrast, the present gradient coil assembly is designed to generate higher order, e.g. third order, fifth order, and beyond, non-zero gradient magnetic filed components. Such non-zero components aid in desired performance characteristics, such as fast switching, high duty cycles, and high peak gradients.

Invariably, the higher order harmonics of the gradient magnetic field cause image distortion by introducing spatial misregistration of spins. As is described more fully below, gradient distortion coefficients, which are caused by the non-zero higher order harmonics, are calculated. With the gradient distortion coefficients known, AC current pulses are superimposed on the shim coils concurrently with the gradient pulses on the gradient coils in order to compensate for distortions. In other words, DC currents are applied to the shim coils in order to correct inhomogeneities in the main magnetic field and AC current pulses are superimposed on the shim coils to correct for the distortions caused by the higher orders of the gradient magnetic field.

In addition, prior art gradient coils sets typically are designed such that their gradient magnetic field profile has an inherent rollover point along, but near the edge of its respective axis. At the rollover point, the first derivative of the gradient magnetic field is zero. After passing the rollover point, where the first derivative is zero, the gradient field takes on non-unique values, i.e., assumes identical values to the gradient field on both sides of the rollover point. This leads to aliasing. When portions of the subject are disposed between the rollover point and the bore, areas of the subject that are located beyond the rollover point will alias back into the image, which causes ghosting of the image. Signals from two planes near the edge that are subject to the same gradient field strength are indistinguishable and are combined. In this manner, a ghost of the material beyond the rollover point is folded back on the material inside the rollover point.

In contrast, the present gradient coil assembly has a flux density that possesses no such rollover point within the physical volume bounded by the inner former. By designing the x, y, and z-gradient coils such that the first derivative of the gradient magnetic field in and adjacent to the examination region is non-zero, i.e., there is no rollover point, the above-discussed aliasing problems are minimized. Because there is no rollover point on the graph of gradient magnetic field versus position, all data values are unique.

The theoretical development, the design procedure and the numerical results for an exemplary shielded gradient coil having non-zero higher order terms with no rollover point of the gradient magnetic field along its perspective axis and inside the physical boundaries defined by the inner surface of the gradient tube is now discussed. While the present discussion focusses on shielded gradient coils sets, it is to be appreciated that the present invention is applicable to non-shielded gradient coil sets as well. Specifically, the theoretical development, the design, and the results of a gradient coil where the z component of the magnetic field varies linearly along the transverse direction (x, y-gradient coil), as well as, the axial gradient coil (z-gradient coil) will be presented. The x-gradient coil will be presented in its entirety as a representative for the transverse coils.

Figure 3:
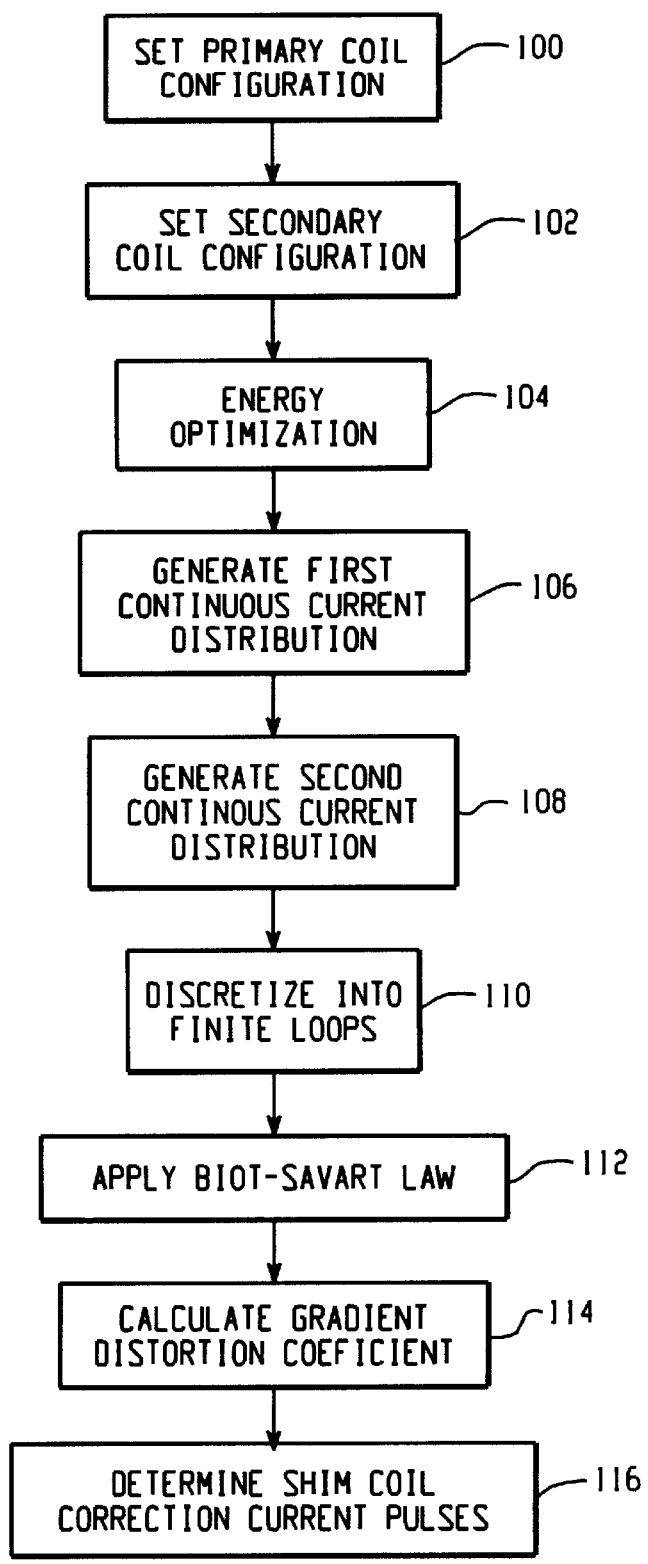
FIG. 3 is a flow chart for designing a shielded gradient coil assembly having non-zero higher order terms of the gradient magnetic field in accordance with the present invention.

The flow chart for designing such a gradient coil structure is shown in FIG. 3. Initially, a geometric configurations of the primary gradient coil step 100 sets the primary coil configuration and a secondary shielding coil configuration step 102 sets the secondary coil configuration. Namely, radius and length for each coil set are chosen. Next, an energy, and optionally inductance, minimization step 104 optimizes the primary gradient coil set. As a result of the minimization process 104, a first continuous current distribution generation step 106 generates the current distribution for the primary gradient coil set. The first continuous current distribution is confined to the geometric boundaries defined in step 100. The first current distribution is selected such that it generates a magnetic gradient field across the examination region having non-zero higher order terms. In addition, the first derivative of the gradient magnetic field in and around the examination region is non-zero. Following this step, a second continuous current distribution selection step 108 generates the current distribution for the secondary, shielding coil set such that the second continuous current distribution is confined to the geometric boundaries defined in step 102. The second continuous current distribution generates a magnetic field which, when combined with the magnetic field from the first current distribution, generates a substantially zero fringe magnetic field outside the secondary coil.

Further, in a current discretization step 110, the continuous current distribution of the primary gradient coil set and the secondary, shielding coil set are discretized to generate the number of turns which is required for each coil within each coil set. Optionally, a verifying step 112 applies the Biot-Savart law to the discrete current pattern to verify its validity. Gradient distortion coefficients are calculated 114 for the x, y, and z gradient coils using a spherical decomposition algorithm. Preferably, the orders are normalized to the first derivative of the magnetic field. Once the gradient distortion coefficients are known, shim coil correction current pulses are calculated 116, which will compensate for the gradient distortions.

The theoretical development of the energy optimization algorithm step 104 is discussed for both the transverse and the axial gradient coil. The development is done for a self-shielded gradient coil structure because the algorithm for optimizing a non-shielded gradient coil structure is identical to the algorithm for the self-shielded gradient coil structure. For the actively shielded gradient coil design, the total length of the primary coil is denoted as $L_a$. The length of the shielding coil is assumed to be infinite. The radius of the primary coil is denoted as a, while the radius of the shielding coil is denoted as b.

Initially, in the design of the finite, shielded, transverse x-gradient coil, the gradient magnetic field must be anti-symmetric in the x direction around the geometric center of this coil, while it is symmetric along the y and z directions. In order to generate such a field, the analytical expression of the current for the primary coil is written as:

$$\vec{J}^a(\vec{r}) = [j_\phi^a(\phi, z)\hat{a}_\phi + j_z^a(\phi, z)\hat{a}_z]\delta(\rho - a) \tag{1}$$

where $\delta(\rho - a)$ is the restriction that the current is confined on the cylindrical surface with radius a. The restriction to inner coil length, the confinement of the current density on the cylindrical surface, the azimuthal and axial symmetries for the $j_\phi^a$ and $j_z^a$ and the demand that the current density obeys the continuity equation provide the Fourier series expansion for both components around the geometric center of the coil as follows:

$$j_\phi^a(\phi, z) = \cos(\phi)\sum_{n=1}^{\infty} j_{\phi n}^a \cos(k_n z) \text{ for } |z| \le \frac{L_a}{2} \tag{2}$$

$$j_z^a(\phi, z) = \sin(\phi)\sum_{n=1}^{\infty} \frac{-j_{\phi n}^a}{k_n a} \sin(k_n z) \text{ for } |z| \le \frac{L_a}{2} \tag{3}$$

In this case $j_{\phi n}^a$ are the Fourier coefficients, $L_a$ represents the total length of the inner coil, and $k_n = (2n\pi)/L_a$ because the current can not flow off the ends of the cylinder. Furthermore, both current components are zero for $|z| > L_a/2$.

In order to minimize the fringe field of the primary coil in the area which is outside both the primary and the shielding coils, the Fourier transform of the current for the shielding coil must satisfy the following relationship:

$$j_\phi^b(\pm 1, k) = -\frac{aI_1'(ka)}{bI_1'(kb)} j_\phi^a(\pm 1, k) \tag{4}$$

with $$j_\phi^a(\pm 1, k) = \frac{L_a}{4}\sum_{n=1}^{\infty} j_{\phi n}^a \psi_n(k)$$

$$\psi_n(k) = \left[\frac{\sin(k - k_n)\frac{L_a}{2}}{(k - k_n)\frac{L_a}{2}} + \frac{\sin(k + k_n)\frac{L_a}{2}}{(k + k_n)\frac{L_a}{2}}\right] \tag{5}$$

In this case, the expression for the z component of the gradient magnetic field in the area inside both coils can be written as:

$$B_z = -\frac{\mu_0 a L_a}{4\pi}\cos(\phi) \tag{6}$$

$$\sum_{n=1}^{\infty} j_{\phi n}^a \int_0^{+\infty} dk\, k\cos(kz)\psi_n(k)I_1(k\rho)K_1'(ka)\left[1 - \frac{I_1'(ka)K_1'(kb)}{I_1'(kb)K_1'(ka)}\right]$$

where $I_m'$, $K_m'$ represent the derivatives with respect to the argument of the modified Bessel functions of the first and the second kind. Furthermore the expression for the stored magnetic energy can also be written as:

$$W = -\frac{\mu_0 a^2 L_a^2}{16} \tag{7}$$

$$\sum_{n=1}^{\infty}\sum_{n'=1}^{\infty} j_{\phi n}^a j_{\phi n'}^a \int_0^{+\infty} dk\, \psi_{n'}(k)I_1'(ka)K_1'(ka)\left[1 - \frac{I_1'(ka)K_1'(kb)}{I_1'(kb)K_1'(ka)}\right]$$

Alternatively, W may be replaced by an arbitrary quadratic function with respect to current which will lead to different properties in the final design. For the higher order derivatives for the gradient magnetic field, considering only odd terms due to the symmetry conditions, the expressions for the odd derivative terms as derived from equation (6) are:

$$B_z^{2n+1}\Big|_{\rho=\rho_0} = \qquad (8)$$

$$\frac{\partial^{2n+1} B_z}{\partial \rho^{2n+1}}\Big|_{\rho=\rho_0} = -\frac{\mu_0 a L_a}{4\pi}\cos(\phi)\sum_{n=1}^{\infty} j_{\phi_n}^a \int_0^{+\infty} dk\, k\cos(kz)\psi_n(k)\frac{\partial^{2n+1} I_1(k\rho_0)}{\partial \rho^{2n+1}}\Big|_{\rho=\rho_0}$$

$$K_1'(ka)\left[1 - \frac{I_1'(ka)K_1'(kb)}{I_1'(kb)K_1'(ka)}\right] \text{ for } n = 0, 1, 2, 3, \ldots, N$$

As a next step, the functional E is constructed in terms of W and $B_z^{(2n+1)}$ for the derivative constraints, and the alternative F functional in terms of W and $B_z$ for the field constraints as:

$$E(j_{\phi_n}^a) = W - \sum_{j=1}^{N} \lambda_j (B_z(\vec{r}_j)^{2n+1} - B_{zSC}(\vec{r}_j)^{2n+1})\Big|_{z=z_0,\rho=\rho_0} \text{ derivative constraints}$$

$$F(j_{\phi_n}^a) = W - \sum_{j=1}^{N} \lambda_j (B_z(\vec{r}_j) - B_{zSC}(\vec{r}_j)) \text{ field constraints}$$

where $\lambda_j$ are the Lagrange multipliers and $B_{zsc}^{2n+1}$, $B_{zsc}$ represent the constraint values of the derivative or field constraints for the z component of the magnetic field at the specified N points. Minimizing E or F, a quadratic function of the current, with respect to the current coefficients $j_{\phi_n}^a$, produces a matrix equation which $j_{\phi_n}^a$ must satisfy:

$$\sum_{n'=1}^{\infty} j_{\phi_{n'}}^a \frac{aL_a\pi}{2}\int_0^{\infty} dk\psi_n(k)\psi_{n'}(k)I_1(ka)K_1(ka)\left[1 - \frac{I_1(ka)K_1(kb)}{I_1(kb)K_1(ka)}\right] = \qquad (9)$$

$$\sum_{j1}^{N} \lambda_j \cos(\phi_j) \int_0^{\infty} dk\, k\cos(kz_j)\psi_n(k) I_1(k\rho_j)$$

$$K_1(ka)\left[1 - \frac{I_1(ka)K_1(kb)}{I_1(kb)K_1(ka)}\right] \text{ field constraints}$$

$$\sum_{n'=1}^{\infty} j_{\phi_{n'}}^a \frac{aL_a\pi}{2}\int_0^{\infty} dk\psi_n(k)\psi_{n'}(k)I_1(ka)K_1(ka)\left[1 - \frac{I_1(ka)K_1(kb)}{I_1(kb)K_1(ka)}\right] = \qquad (10)$$

$$\sum_{j1}^{N} \lambda_j \cos(\phi_j)\int_0^{\infty} dk\, k\cos(kz_j)\psi_n(k)\frac{\partial^{2n1} I_1(k\rho_0)}{\partial \rho^{2n1}}\Big|_{\rho\rho_0}$$

$$K_1(ka)\left[1 - \frac{I_1(ka)K_1(kb)}{I_1(kb)K_1(ka)}\right] \text{ derivative constraints}$$

where the evaluation of the Lagrange multipliers may be done via the constraint equations for field and derivative constraints.

By truncating the previous infinite summations at M terms and using compact notation, the previous expressions (9) and (10) are modified as:

$$\sum_{n'=1}^{M} j_{\phi_{n'}}^a C_{n',n} = \sum_{j=1}^{N} \lambda_j D_{jn} \qquad (11)$$

or in matrix form:

$$J^a C = \lambda D \Rightarrow J^a = \lambda D C^{-1} \qquad (12)$$

but $$B_z = J^a D^t \Rightarrow B_z = \lambda D C^{-1} D^t \qquad (13)$$

which leads to $$\lambda = B_z[DC^{-1}D^t]^{-1} \Rightarrow J^a = B_z[DC^{-1}D^t]^{-1}DC^{-1} \qquad (14)$$

Inverting the previous matrix equation leads to a solution for $j_{\phi n}^a$, and hence for the current density. When the continuous current distribution for both the primary and shield coils is evaluated, the stream function technique is used to discretize the current density for both primary and shield coils. This yields an absolute integer number of turns for both coils for a given common current value per loop. Following the discretization, the magnetic gradient field and the eddy currents inside the desired imaging volume are calculated.

For the design of an exemplary shielded $G_x$ gradient coil, the radius of the cylinder for the primary coil is equal to 0.338393 m and its total length is restricted to 1.132 m. In addition, the radius of the secondary coil is equal to 0.435324 m. The constraints are shown in Table 1 for the design of this exemplary gradient coil. As shown in Table 1, the first constraint point defines a gradient strength for the first primary and single shield coil to be 26.0 mT/m. The second constraint point specifies a +2.0\% linearity of the gradient field along the gradient (x) axis and up to the distance of 28.5 cm for the isocenter of the gradient field, while the third constraint point specifies a −22% uniformity of the gradient field inside the 45 cm imaging volume.

TABLE 1

Constraint set used for the design of an exemplary $G_x$ gradient coil.

| N | $\rho_i$ (m) | $\phi_i$ (rad) | $Z_i$ (m) | $B_{zsc}$ (T) |
|---|---|---|---|---|
| 1 | 0.001 | 0.0 | 0.000 | 0.000026 |
| 2 | 0.285 | 0.0 | 0.000 | 0.007558193 |
| 3 | 0.001 | 0.0 | 0.225 | 0.00002028 |

For the exemplary $G_y$ shielded gradient coil, the radius of the primary coil is a=0.334018 m with a length of 1.136 m, while the radius of the secondary coil is b=0.431014 m. As shown in Table 2, the first constraint point defines a gradient strength to be 26.0 mT/m. The second constraint point specifies a 2% linearity of the field gradient along the gradient (y) axis and up to the distance of 32 cm for the isocenter of the gradient field, while the third constraint point specifies a −21% uniformity of the gradient field inside the 45 cm imaging volume.

TABLE 2

Constraint set used for the design of an exemplary $G_y$ gradient coil.

| N | $\rho_i$ (m) | $\phi_i$ (rad) | $Z_i$ (m) | $B_{zsc}$ (T) |
|---|---|---|---|---|
| 1 | 0.001 | 0.0 | 0.000 | 0.000026 |
| 2 | 0.3205 | 0.0 | 0.000 | 0.007558193 |
| 3 | 0.001 | 0.0 | 0.225 | 0.00002058 |

Figure 4:
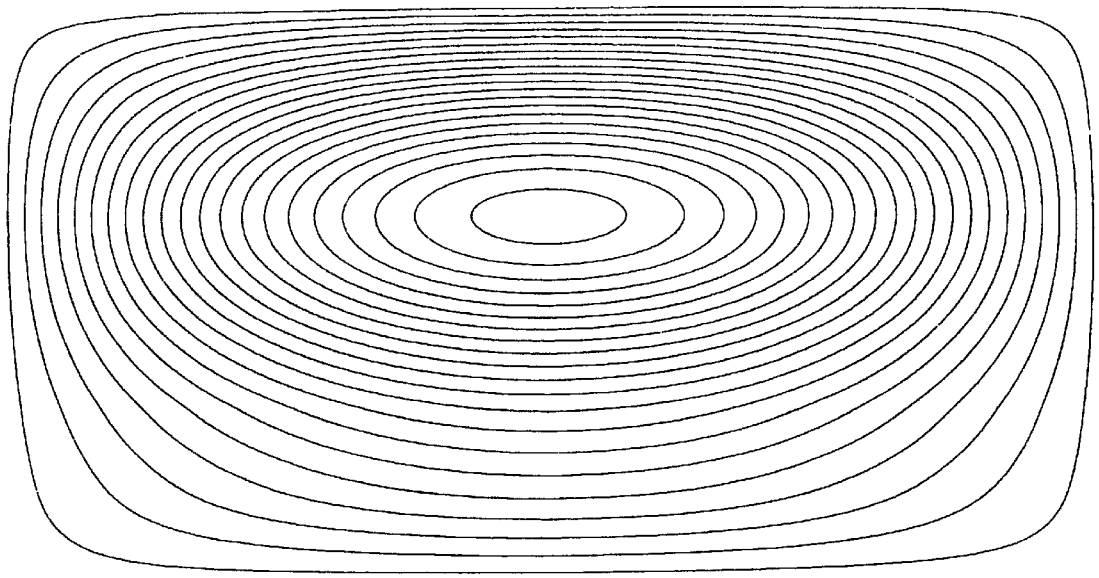
FIG. 4 is a diagrammatic illustration of one quadrant of an exemplary primary x-gradient coil in accordance with the present invention.
Figure 5:
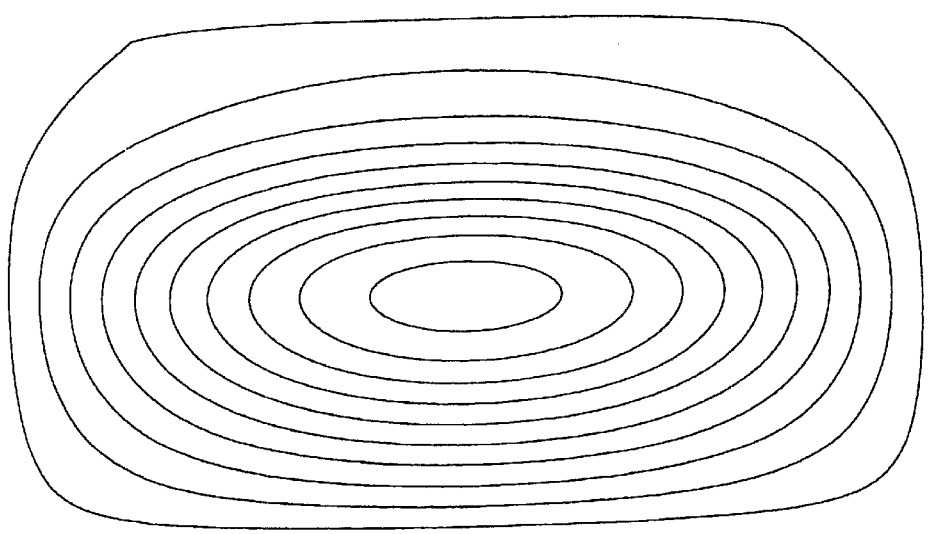
FIG. 5 is a diagrammatic illustration of one quadrant of an exemplary shielding x-gradient coil in accordance with the present invention.
Figure 6:
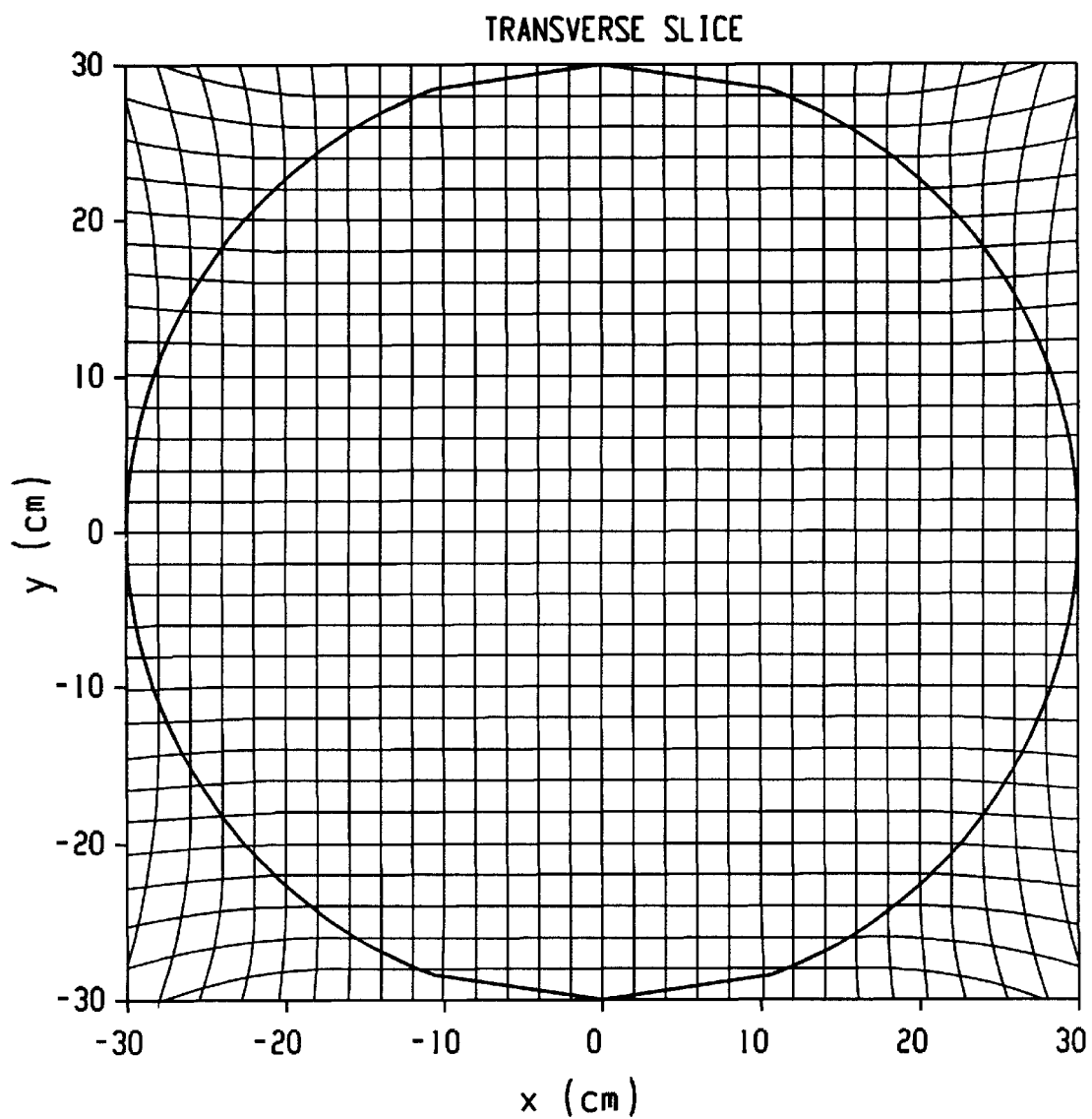
FIG. 6 is a distortion grid for a transverse slice through the z-0.0 plane for an exemplary gradient coil set with no rollover point in accordance with the present invention.

With the presence of these constraints in Table 1 and Table 2 and the application of the inverse approach methodology, the values for the Fourier coefficients for the current density of the shielded gradient coils are generated. By applying the stream function technique to the continuous current densities for both transverse shielded coils $G_y$, $G_x$, the discrete current patterns for these coils were generated. Specifically, for the $G_x$ gradient coil, the stream function technique generates 21 discrete loops on the primary coil, as shown in FIG. 3, and 10 loops on the single shield as shown in FIG. 4. The common current per loop is 382.74 Amps. In this embodiment, the eddy current from the discrete coil configuration is 0.295% over a 50 cm DSV. By discretizing the current density for the $G_y$ gradient coil, the current density for the primary coil is approximated by 21 loops with a common current of 371.36 Amps, while the shielding coil is approximated by 10 loops carrying the same current per loop. For the $G_y$ gradient coil, the eddy currents are only 0.257%. Employing the Biot-Savart law to the discrete current densities for both the $G_y$, $G_x$ shielded gradient coils, the gradient magnetic field for both these coil structure is evaluated along the perspective gradient axis and at z=0.0 m plane. It is to be appreciated that inside the physical region defined by the inner surface of the gradient coil no rollover is present, as shown in FIG. 6. Table 3 and Table 4 illustrate the magnetic properties for the $G_y$, $G_x$ shielded gradient coils.

TABLE 3

Magnetic properties for the exemplary $G_x$ shielded gradient coil.

| Property | A COIL | B COIL | COMBINED |
|---|---|---|---|
| Middle Cu Radius | 338.393 mm | 435.3244 mm | 650 mm/880 mm envelope |
| Electrical Length | 1132 mm | 1539 mm | |
| Inductance + Cable | | | 598 μH |
| Discrete Turns | 21 | 10 | |
| Resistance + Cable | | | 0.167Ω |
| Linearity at 50 cmDSV | +5.06% | +13% | +4.75% |
| Rollover in ρ (cm) | Greater than Body coil radius | Greater than Body coil Radius | Greater than Body coil Radius |
| Gradient Strength | | | |
| @400A | 44.53 mT/m | −17.3 mT/m | 27.2 mT/m |
| Slew Rate Linear | | | |
| @650V | | | 66 T/m/sec |
| @1200V | | | 129 T/m/s |
| Slew Rate Sine | | | |
| @600V | | | 73 T/m/sec |
| @1200V | | | 136 T/m/sec |

TABLE 3-continued

Magnetic properties for the exemplary $G_x$ shielded gradient coil.

| Property | A COIL | B COIL | COMBINED |
|---|---|---|---|
| Residual Eddy Current @50 cm DSV | | | <0.3% |
| Net Thrust Force (lbs) @400 A | | | 44 lbs |

TABLE 4

Magnetic properties for the exemplary $G_y$ shielded gradient coil.

| Property | A COIL | B COIL | COMBINED |
|---|---|---|---|
| Middle Cu Radius | 334.0175 mm | 431.014 mm | 660 mm/880 mm Envelope |
| Electrical Length | 1132 mm | 1535 mm | |
| Inductance + Cable | | | 595 μH |
| Discrete Turns | 21 | 10 | |
| Resistance + Cable | | | 0.166Ω |
| Linearity at 50 cmDSV | +3.6% | +13% | +2.5% |
| Rollover in ρ (cm) | Greater than Body coil Radius | Greater than Body coil Radius | Greater than Body coil Radius |
| Rollover in z (cm) | | | 34.2 cm |
| Gradient Strength @400A | 45.74 mT/m | −17.74 mT/m | 28 mT/m |
| Slew Rate Linear | | | |
| @650V | | | 69 T/m/sec |
| @1200V | | | 133 T/m/sec |
| Slew Rate Sine | | | |
| @650V | | | 76 T/m/sec |
| @1200V | | | 141 T/m/sec |
| Residual Eddy Current @50 cm DSV | | | <0.3% |
| NET THRUST FORCE (LBS) @400A | | | 48 lbs |

Initially, for the design of the finite, shielded, axial $G_z$ gradient coil, the gradient magnetic field must be antisymmetric in the z direction around the geometric center of this coil, while being symmetric along the x and y directions. There is no azimuthal dependence on the current density. To generate such a field, the analytical expression of the current for the primary coil is written as:

$$\vec{J}^a(\vec{r}) = j_\phi^a(z)\hat{a}_\phi \delta(\rho - a) \qquad (15)$$

where $\delta I(\rho - a)$ is the restriction that the current is confined on the cylindrical surface with radius a. The restriction to inner coil length, the confinement of the current density on the cylindrical surface, the azimuthal and axial symmetries for the $j_\phi^a$, and the demand that the current density obeys the continuity equation yield the Fourier series expansion for both components around the geometric center of the coil as follows:

$$j_\phi^a(z) = \sum_{n=1}^{\infty} j_{\phi n}^a \sin(k_n z) \text{ for } |z| \leq \frac{L_a}{2} \qquad (16)$$

where $j_{\phi n}^a$ are the Fourier coefficients, $L_a$ represents the total length of the inner coil, and, because the current can not flow off the ends of the cylinder, $k_n=(2n\pi)/L_a$. Furthermore, both current components are zero for $|z|>L_a/2$.

In order to minimize the fringe field of the primary coil in the area which is outside both the primary and the shielding coil, the Fourier transform of the current for the shielding coil satisfies the following relationship:

$$j_\phi^b(k) = -\frac{aI_1(ka)}{bI_1(kb)} j_\phi^a(k) \qquad (17)$$

with $$j_\phi^a(k) = \frac{iL_a}{2} \sum_{n=1}^{\infty} j_{\phi n}^a \psi_n(k) \psi_n(k) = \left[ \frac{-\sin(k-k_n)\frac{L_a}{2}}{(k-k_n)\frac{L_a}{2}} + \frac{\sin(k+k_n)\frac{L_a}{2}}{(k+k_n)\frac{L_a}{2}} \right] \qquad (18)$$

In this case, the expression for the z component of the magnetic field in the area inside both coils is written as:

$$B_z = -\frac{\mu_0 a L_a}{2\pi} \qquad (19)$$

$$\sum_{n=1}^{\infty} j_{\phi n}^a \int_0^{+\infty} dk k \sin(kz) \psi_n(k) I_0(k\rho) K_1(ka) \left[ 1 - \frac{(ka)K_1(kb)}{I_1(kb)K_1(ka)} \right]$$

where $I_m'$ and $K_m'$ represent the derivatives with respect to the argument of the modified Bessel functions of the first and the second kind. In addition, the higher order derivatives for the z component of the magnetic field along the z direction are given as:

$$B_z^{2n+1}\Big|_{z=z_0} = \qquad (20)$$

$$\frac{\partial^{2n+1} B_z}{\partial z^{2n+1}}\Big|_{z=z_0} = -\frac{\mu_0 a L_a}{2\pi} \sum_{n=1}^{\infty} j_{\phi n}^a \int_0^{+\infty} dk k(-1)^{n+2} k^{2n+1} \cos(kz_0)$$

$$\psi_n(k) I_0(k\rho) K_1(ka) \left[ 1 - \frac{I_1(ka)K_1(kb)}{I_1(kb)K_1(ka)} \right]$$

Furthermore the expression for the stored magnetic energy can also be written as:

$$W = \frac{\mu_0 a^2 L_a^2}{4} \qquad (21)$$

$$\sum_{n=1}^{\infty} \sum_{n'=1}^{\infty} j_{\phi n}^a j_{\phi n'}^a \int_0^{+\infty} dk \psi_n(k) \psi_{n'}(k) I_1(ka) K_1(ka) \left[ 1 - \frac{I_1(ka)K_1(kb)}{I_1(kb)K_1(ka)} \right]$$

As a next step, the functional E is constructed in terms of W and $B_z^{(2n+1)}$ for the derivative constraints, and the alternative F functional is constructed in terms of W and $B_z$ for the field constraints as:

$$E(j_{\phi n}^a) = W - \sum_{j=1}^{N} \lambda_j \left( B_z(\vec{r}_j)^{2n+1} - B_{zSC}(\vec{r}_j)^{2n+1} \right)\Big|_{z=z_0, \rho=\rho_0} \text{ derivative constraints}$$

$$F(j_{\phi n}^a) = W - \sum_{j=1}^{N} \lambda_j (B_z(\vec{r}_j) - B_{zSC}(\vec{r}_j)) \text{ field constraints}$$

where $\lambda_j$ are the Lagrange multipliers and $B_{zSC}^{2n+1}$ and $B_{zsc}$ represent the constraint values of the derivative or field constraints for the z component of the magnetic field at the specified N points. Minimizing E or F, a quadratic function of the current, with respect to the current coefficients $j_{\phi n}^a$, reveals a matrix equation in which $j_{\phi n}^a$ must satisfy:

$$\sum_{n'=1}^{\infty} j_{\phi n'}^a (aL_a\pi) \int_0^{+\infty} dk \psi_n(k) \psi_{n'}(k) I_1(ka) K_1(ka) \left[ 1 - \frac{I_1(ka)K_1(kb)}{I_1(kb)K_1(ka)} \right] = \qquad (22)$$

$$-\sum_{j=1}^{N} \lambda_j \int_0^{+\infty} dk k \sin(kz_j) \psi_n(k) I_0(k\rho_j)$$

$$K_1(ka) \left[ 1 - \frac{I_1(ka)K_1(kb)}{I_1(kb)K_1(ka)} \right] \text{ field constraints}$$

$$\sum_{n'=1}^{\infty} j_{\phi n'}^a (aL_a\pi) \int_0^{+\infty} dk \psi_n(k) \psi_{n'}(k) I_1(ka) K_1(ka) \left[ 1 - \frac{I_1(ka)K_1(kb)}{I_1(kb)K_1(ka)} \right] = \qquad (23)$$

$$-\sum_{j=1}^{N} \lambda_j \int_0^{+\infty} dk k(-1)^{n+2} k^{2n+1} \cos(kz_0) \psi_n(k) I_0(k\rho_j)$$

$$K_1(ka) \left[ 1 - \frac{I_1(ka)K_1(kb)}{I_1(kb)K_1(ka)} \right] \text{ derivative constraints}$$

where the evaluation of the Lagrange multipliers is done via the constraint equation. After truncating the previous infinite summations at M terms and using compact notation, the previous expressions (22) and (23) are modified as:

$$\sum_{n'=1}^{M} j_{\phi n'}^a C_{n',n} = \sum_{j=1}^{N} \lambda_j D_{jn} \qquad (24)$$

or in matrix form:

$$J^a C = \lambda D \Rightarrow J^a = \lambda D C^{-1} \qquad (25)$$

but $$B_z = J^a D^t \Rightarrow B_z = \lambda D C^{-1} D^t \qquad (26)$$

which leads to $$\lambda = B_z [DC^{-1}D^t]^{-1} \Rightarrow J^a = B_z [DC^{-1}D^t]^{-1} DC^{-1} \qquad (27)$$

Inverting the previous matrix equation, yields a solution for $j_{\phi n}^a$, and hence for the current density. The center of mass technique is used to discretize the current density for both primary and shield coils in such a way that an absolute integer number of turns for both coils is provided for a given common current value per loop. Following the discretization, the magnetic gradient field and the eddy currents inside the desired imaging volume are calculated.

Similar design procedures were followed for the axial gradient coil. In this embodiment, the radius of the cylinder for the first primary coil is equal to a=0.348145 m and its total length is restricted to 1.050 m. In addition, the radius of the secondary coil is equal to b=0.425929 m. The constraints are shown in Table 5 for the design of this exemplary gradient coil. As shown in Table 5, the first constraint point defines a gradient strength for the first primary and common shield coil to be 28.0 mT/m. The second constraint point specifies a –5.0% linearity of the gradient field along the gradient (z) axis and up to the distance of 22.5 cm for the isocenter of the gradient field, while the rest of the constraint points specify the uniformity of the gradient field inside the 45 cm imaging volume.

TABLE 5

Constraint set used for the design for the $G_z$ gradient coil.

| N | $\rho_i$ (m) | $\phi_i$ (rad) | $Z_i$ (m) | $B_{zsc}$ (T) |
|---|---|---|---|---|
| 1 | 0.0000 | 0.0 | 0.001 | 0.000028 |
| 2 | 0.0000 | 0.0 | 0.000 | 0.00600000 |
| 3 | 0.1125 | 0.0 | 0.001 | 0.0000279 |
| 4 | 0.2250 | 0.0 | 0.001 | 0.0000279 |

With the presence of these constraints in Table 5 and the application of the inverse approach methodology, the values for the Fourier coefficients for the current density shielded $G_z$ coil are generated. Applying the center of mass technique to the continuous current densities for both coils, the discrete current patterns for these coils are generated. Specifically, for the first primary and the shield configuration, the center of mass technique generates 60 discrete loops on the primary coil. The common current per loop is 376.067 Amps. In this case, the eddy current from the discrete coil configuration is 0.19% over a 50 cm DSV. Using elliptic integrals of the first and second kind, the gradient magnetic field for the shielded $G_z$ gradient coil is evaluated. Table 6 illustrates the magnetic properties of the shielded $G_z$ gradient coil.

TABLE 6

Magnetic properties for the exemplary $G_z$ shielded gradient coil.

| Property | Primary Coil | Shield Coil | COMBINED |
|---|---|---|---|
| Middle Cu Radius | 348.145 mm | 425.929 mm | 650 mm/880 mm |
| Electrical Length | 1050 mm | 1362 mm | |
| Inductance + Cable | | | 575 µH |
| Discrete Turns | 54 | 34 | |
| Resistance + Cable | | | 0.174Ω |
| Linearity at 50 cmDSV | –11.0% | –15% | –7.1% |
| Rollover in ρ (cm) | Greater than Body coil Radius | Greater than Body coil Radius | Greater than Body coil Radius |
| Rollover in z (cm) | 37.0 cm | 39.8 cm | 35.6 cm |
| Gradient Strength @400A | 58.94 mT/m | –29.08 mT/m | 29.86 mT/m |

TABLE 6-continued

Magnetic properties for the exemplary $G_z$ shielded gradient coil.

| Property | Primary Coil | Shield Coil | COMBINED |
|---|---|---|---|
| Slew Rate Linear | | | |
| @650V | | | 75 T/m/sec |
| @1200V | | | 146 T/m/sec |
| Slew Rate Sine | | | |
| @650V | | | 83 T/m/sec |
| @1200V | | | 155 T/m/sec |
| Residual Eddy Current @50 cm DSV | | | <0.25% |
| NET THRUST FORCE (LBS) @400A | | | –0.0212 lbs |

Employing the spherical decomposition algorithm inside a 50 cm DSV, the normalized higher order harmonics for the x, y, and z gradient coils are given in Table 7. The orders are normalized to the first derivative of the magnetic field.

TABLE 7

Higher order harmonics for the x, y, and z gradient coils normalized to the first derivative of the magnetic field.

| Order | X Gradient Coil | Y Gradient Coil | Z Gradient coil |
|---|---|---|---|
| 1 | X1 = 1 | Y1 = 1 | Z1 = 1 |
| 3 | X3 = –0.01746 | Y3 = –0.012643 | Z3 = –0.01386 |
| 5 | X5 = –0.02596 | Y5 = –0.021837 | Z5 = –0.044789 |
| 7 | X7 = –0.00418 | Y7 = –0.013692 | Z7 = –0.019567 |
| 9 | X9 = +0.00420 | Y9 = +0.009330 | Z9 = +0.018849 |
| 11 | X11 = –0.00120 | Y11 = –0.002767 | Z11 = –0.008617 |
| 13 | X13 = –0.00022 | Y13 = +0.000552 | Z13 = +0.003052 |

Table 8 illustrates the uncorrected and corrected pixel position when all orders of gradient field inhomogeneities are present and when the 3rd and 5th orders are corrected for the X gradient coil on a 25 cm DSV. Furthermore, table 8 indicates the percentage change for correcting these higher orders. The outcome from the 3rd and 5th order corrected for the gradient field is considered as the basis for the percentage calculation. In addition, table 9 illustrates the uncorrected and corrected pixel position when all orders are present and when the 3rd and 5th orders are corrected for the Y gradient coil on a 25 cm DSV. Furthermore, table 9 indicates the percentage change for correcting these higher orders. The outcome from the 3rd and 5th order corrected for the gradient field is considered as the basis for the percentage calculation. Table 10 illustrates the uncorrected and corrected pixel position when all orders are present and when the 3rd and 5th orders are corrected for the Z gradient coil on a 25 cm DSV. Furthermore, table 10 indicates the percentage change for correcting these higher orders. All columns represent pixel displacement in cm.

TABLE 8

Uncorrected and corrected pixel positions for an exemplary x gradient coil.

| IDEAL | ALL ORDERS | 3rd order Corrected | 3rd and 5th Orders Corrected | % Change |
|---|---|---|---|---|
| 0 | 0 | 0 | 0 | 0% |
| 0.5000 | 0.5000 | 0.5000 | 0.5000 | 0% |
| 2.0000 | 2.0003 | 2.0003 | 2.0000 | 0.0% |
| 5.0000 | 5.0049 | 5.0052 | 5.0000 | 0.1% |
| 5.5000 | 5.5064 | 5.5070 | 5.5000 | 0.12% |
| 6.0000 | 6.0081 | 6.0091 | 6.0000 | 0.13% |
| 6.5000 | 6.5101 | 6.5115 | 6.5000 | 0.16% |
| 7.0000 | 7.0123 | 7.0144 | 7.0000 | 0.18% |
| 7.5000 | 7.5148 | 7.5177 | 7.5001 | 0.2% |
| 8.0000 | 8.0175 | 8.0215 | 8.0001 | 0.22% |
| 8.5000 | 8.5203 | 8.5257 | 8.5001 | 0.24% |
| 9.0000 | 9.0234 | 9.0306 | 9.0002 | 0.26% |
| 9.5000 | 9.5266 | 9.5359 | 9.5003 | 0.28% |
| 10.0000 | 10.0299 | 10.0419 | 10.0004 | 0.30% |
| 10.5000 | 10.5333 | 10.5485 | 10.5006 | 0.33% |
| 11.0000 | 11.0366 | 11.0558 | 11.0009 | 0.36% |
| 11.5000 | 11.5399 | 11.5637 | 11.5012 | 0.33% |
| 12.0000 | 12.0431 | 12.0724 | 12.0017 | 0.35% |
| 12.5000 | 12.5462 | 12.5819 | 12.5023 | 0.35% |

TABLE 9

Uncorrected and corrected pixel positions for an exemplary y gradient coil.

| IDEAL | ALL ORDERS | 3rd order Corrected | 3rd and 5th Order Corrected | % Change |
|---|---|---|---|---|
| 0 | 0 | 0 | 0 | 0% |
| 0.5000 | 0.5000 | 0.5000 | 0.5000 | 0% |
| 2.0000 | 2.0005 | 2.0005 | 2.0000 | 0.03% |
| 5.0000 | 5.0035 | 5.0038 | 5.0000 | 0.07% |
| 5.5000 | 5.5045 | 5.5050 | 5.5000 | 0.08% |
| 6.0000 | 6.0058 | 6.0066 | 6.0000 | 0.10% |
| 6.5000 | 6.5072 | 6.5083 | 6.5001 | 0.11% |
| 7.0000 | 7.0088 | 7.0104 | 7.0001 | 0.13% |
| 7.5000 | 7.5105 | 7.5128 | 7.5002 | 0.14% |
| 8.0000 | 8.0124 | 8.0155 | 8.0003 | 0.16% |
| 8.5000 | 8.5144 | 8.5186 | 8.5004 | 0.17% |
| 9.0000 | 9.0166 | 9.0221 | 9.0006 | 0.18% |
| 9.5000 | 9.5189 | 9.5260 | 9.5010 | 0.19% |
| 10.0000 | 10.0212 | 10.0303 | 10.0012 | 0.20% |
| 10.5000 | 10.5237 | 10.5351 | 10.5014 | 0.21% |
| 11.0000 | 11.0263 | 11.0404 | 11.0028 | 0.21% |
| 11.5000 | 11.5289 | 11.5461 | 11.5038 | 0.22% |
| 12.0000 | 12.0316 | 12.0524 | 12.0052 | 0.22% |
| 12.5000 | 12.5343 | 12.5593 | 12.5071 | 0.22% |

TABLE 10

Uncorrected and corrected pixel positions for an exemplary z gradient coil.

| IDEAL | ALL ORDERS | 3rd order Corrected | 3rd and 5th Order Corrected | % Change |
|---|---|---|---|---|
| 0 | 0.0 | 0 | 0 | 0% |
| 0.5000 | 0.5000 | 0.5000 | 0.5000 | 0% |
| 2.0000 | 1.9998 | 1.9998 | 2.0000 | 0.01% |
| 5.0000 | 4.9969 | 4.9972 | 5.0000 | 0.02% |
| 5.5000 | 5.4957 | 5.4963 | 5.5000 | 0.08% |
| 6.0000 | 5.9943 | 5.9952 | 6.0000 | 0.10% |
| 6.5000 | 6.4925 | 6.4939 | 6.5000 | 0.12% |
| 7.0000 | 6.9904 | 6.9924 | 7.0000 | 0.14% |
| 7.5000 | 7.4878 | 7.4906 | 7.5000 | 0.16% |
| 8.0000 | 7.9847 | 7.9886 | 7.9998 | 0.19% |
| 8.5000 | 8.4811 | 8.4864 | 8.4998 | 0.22% |
| 9.0000 | 8.9767 | 8.9838 | 8.9997 | 0.26% |
| 9.5000 | 9.4716 | 9.4810 | 9.4995 | 0.30% |
| 10.0000 | 9.9657 | 9.9778 | 9.9993 | 0.34% |
| 10.5000 | 10.4588 | 10.4743 | 10.4990 | 0.38% |
| 11.0000 | 10.9507 | 10.9705 | 10.9987 | 0.44% |
| 11.5000 | 11.4415 | 11.4663 | 11.4983 | 0.49% |
| 12.0000 | 11.9309 | 11.9617 | 11.9977 | 0.56% |
| 12.5000 | 12.4187 | 12.4567 | 12.4970 | 0.63% |

It should be appreciated that the specified current patterns can be changed to produce either better linearity at the price of coil efficiency, and/or greater efficiency at the price of linearity. Further, the dimensions (radius and/or length) of the cylindrical gradient coils can be changed to be increased or decreased according to the preferred application. In addition, the lengths of the primary coils and/or the secondary coils can be similar or different.

The various correction coils of the shim set may be shielded or not. In addition, the order of the field inhomogeneities that are correctable by the active shim set in unlimited. The multi-axis shim set may be incorporated with alternative gradient coil geometries, such as elliptical, planar, flared, and the like. The proposed shim set and gradient coil design for the primary and shielding coils may be bunched or thumbprint designs or any combination of the two. In addition each active shim set may be used to compensate for eddy currents due to gradient pulsing. It is to be appreciated that one shim set may be used to corrected gradient magnetic field inhomogeneities for both a whole-body gradient coil and an insertable head gradient coil set or an generation of gradient coil mounted or inserted into the same magnet/active shim set.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance apparatus comprising:
   a main magnet which generates a main magnetic field through and surrounding an examination region, said main magnetic field having inhomogeneities;
   a gradient coil assembly which generates gradient magnetic fields across the examination region, said gradient magnetic fields having higher order harmonics;
   a multi-axis shim set disposed adjacent the gradient coil assembly, said multi-axis shim set (i) canceling inhomogeneities in the main magnetic field, and (ii) compensating for distortions caused by the higher order harmonics of the gradient magnetic field;
   an RF transmitter and coil assembly positioned adjacent to the examination region such that it excites magnetic resonance dipoles in and adjacent the examination region;

an RF coil and receiver assembly which receives and demodulates magnetic resonance signals from the resonating dipoles; and, a reconstruction processor for reconstructing the demodulated magnetic resonance signals into an image representation.

2. The magnetic resonance apparatus according to claim 1, wherein the multi-axis shim set includes:

a plurality of correction coils which are selectively excitable to generate a plurality of main magnetic and gradient magnetic field corrections.

3. The magnetic resonance apparatus according to claim 2, further comprising:

a shim set power supply which selectively applies at least one of (i) DC currents and (ii) AC current pulses to the multi-axis shim set.

4. The magnetic resonance apparatus according to claim 2, further comprising a shim set power supply which selectively applies DC currents with AC current pulses superimposed thereon to the shim set to correct main magnetic field and gradient magnetic field inhomogeneities.

5. The magnetic resonance apparatus according to claim 1, wherein the gradient coil assembly includes:

a primary gradient coil set disposed adjacent the examination region, said primary gradient coil set including an array of conductive loops for generating the gradient magnetic fields along three orthogonal axes;

a secondary shielding coil set disposed between the primary coil assembly and the main magnet, said secondary shielding coil set including an array of conductive loops such that a current density flowing thereon causes a magnetic flux density which interacts with a magnetic flux density generated by the primary magnetic field to substantially zero a net magnetization flux density outside an area defined by the secondary shielding coil set.

6. The magnetic resonance imaging apparatus according to claim 1, wherein the gradient magnetic field generated along at least one axis has (i) a substantially constant slope along a central region of the examination region and (ii) an increasingly steep slope adjacent edges of the examination region.

7. The magnetic resonance imaging apparatus according to claim 1, wherein the gradient coil assembly includes three primary gradient coil sets, one for generating a gradient magnetic field along each of three orthogonal axes, each of the primary gradient coil sets generating a corresponding gradient magnetic field which is linear adjacent a central region of the examination region and monotonically increasing adjacent edges of the examination region.

8. A method of magnetic resonance imaging comprising:

(a) generating a temporally constant main magnetic field through an examination region, said main magnetic field having inhomogeneities;

(b) inducing resonance in selected dipoles in the examination region such that the dipoles generate magnetic resonance signals;

(c) generating a gradient magnetic field across the examination region to encode the magnetic resonance signals along at least one axis, said gradient magnetic field having higher order harmonics which cause image distortions;

(d) applying correction currents to shim coils to (i) minimize inhomogeneities in the main magnetic field, and (ii) compensate for the higher order harmonics in the gradient magnetic field;

(e) receiving and demodulating the encoded magnetic resonance signals; and (f) reconstructing the demodulated signals into an image representation free of distortions caused by higher order harmonics of the gradient magnetic field.

9. The method according to claim 8, wherein generating the gradient magnetic field across the examination region includes:

applying gradient current pulses to a gradient coil assembly.

10. The method according to claim 9, wherein applying correction currents to the shim coils includes:

applying a DC current to the shim coils to minimize the inhomogeneities in the main magnetic field; and, superimposing AC current pulses on selected ones of the shim coils to compensate for the higher order harmonics in the gradient magnetic field.

11. The method according to claim 10, wherein the AC current pulses are superimposed on the selected ones of the shim coils concurrently with the application of the gradient current pulses to the gradient coil assembly.

12. The method according to claim 9, wherein applying correction currents compensates for third and fifth order harmonics in the gradient magnetic field.

13. In a magnetic resonance apparatus in which a temporally constant main magnetic field is generated in an examination region, said magnetic field having inhomogeneities, radio frequency pulses excite and manipulate resonance of selected dipoles in a subject disposed in the examination region, gradient pulses applied to at least one gradient coil assembly generate gradient magnetic fields for encoding the excited resonance, said gradient magnetic fields having inhomogeneities caused by higher order harmonics, and received and demodulated resonance signals are reconstructed into an image representation, a method of real-time correction of the main and gradient magnetic field inhomogeneities includes:

applying DC correction currents to a multi-axis shim set, said DC correction currents minimizing the inhomogeneities in the main magnetic field; and superimposing AC correction current pulses on the DC correction currents, said AC correction current pulses compensating for the inhomogeneities in the gradient magnetic fields.

14. The method according to claim 13, wherein the AC correction current pulses are superimposed on the DC correction currents concurrently with the application of the gradient current pulses to the gradient coil assembly.

* * * * *